US010988718B2

(12) United States Patent
Parson et al.

(10) Patent No.: US 10,988,718 B2
(45) Date of Patent: Apr. 27, 2021

(54) TUNGSTEN POST-CMP CLEANING COMPOSITION

(71) Applicants: ENTEGRIS, INC., Billerica, MA (US);
Thomas Parson, Meriden, CT (US);
Shrane-Ning Jenq, Hsin-chu (TW);
Steven Medd, Danbury, CT (US);
Daniela White, Ridgefield, CT (US);
Michael White, Ridgefield, CT (US);
Donald Frye, Sherman, CT (US)

(72) Inventors: Thomas Parson, Meriden, CT (US);
Shrane-Ning Jenq, Hsin-chu (TW);
Steven Medd, Danbury, CT (US);
Daniela White, Ridgefield, CT (US);
Michael White, Ridgefield, CT (US);
Donald Frye, Sherman, CT (US)

(73) Assignee: ENTEGRIS, INC., Billerica, MA (US)

( * ) Notice: Subject to any disclaimer, the term of this patent is extended or adjusted under 35 U.S.C. 154(b) by 144 days.

(21) Appl. No.: 16/308,053

(22) PCT Filed: Mar. 9, 2017

(86) PCT No.: PCT/US2017/021624
§ 371 (c)(1),
(2) Date: Dec. 7, 2018

(87) PCT Pub. No.: WO2017/156304
PCT Pub. Date: Sep. 14, 2017

(65) Prior Publication Data
US 2019/0177671 A1    Jun. 13, 2019

Related U.S. Application Data

(60) Provisional application No. 62/305,781, filed on Mar. 9, 2016.

(51) Int. Cl.
| | | |
|---|---|---|
| *C11D 7/32* | (2006.01) |
| *C11D 11/00* | (2006.01) |
| *C11D 3/20* | (2006.01) |
| *C11D 3/37* | (2006.01) |
| *H01L 21/02* | (2006.01) |
| *C11D 1/08* | (2006.01) |
| *C11D 1/00* | (2006.01) |
| *C23F 1/26* | (2006.01) |
| *C23F 1/28* | (2006.01) |
| *B08B 3/08* | (2006.01) |
| *C11D 3/04* | (2006.01) |
| *C11D 3/30* | (2006.01) |
| *C11D 3/32* | (2006.01) |
| *C11D 3/33* | (2006.01) |

(52) U.S. Cl.
CPC ............ *C11D 11/0047* (2013.01); *B08B 3/08* (2013.01); *C11D 1/008* (2013.01); *C11D 1/08* (2013.01); *C11D 3/044* (2013.01); *C11D 3/2065* (2013.01); *C11D 3/2082* (2013.01); *C11D 3/2096* (2013.01); *C11D 3/30* (2013.01); *C11D 3/32* (2013.01); *C11D 3/33* (2013.01); *C11D 3/3765* (2013.01); *C11D 3/3776* (2013.01); *C23F 1/26* (2013.01); *C23F 1/28* (2013.01); *H01L 21/02074* (2013.01)

(58) Field of Classification Search
CPC .................................................. C11D 11/0047
USPC ........................................................ 510/175
See application file for complete search history.

(56) References Cited

U.S. PATENT DOCUMENTS

| | | | |
|---|---|---|---|
| 7,300,601 B2 | 11/2007 | Liu et al. | |
| 7,393,819 B2 | 7/2008 | Hsu | |
| 8,906,838 B2 | 12/2014 | Hsu | |
| 2003/0158059 A1 | 8/2003 | Sakai et al. | |
| 2009/0291873 A1* | 11/2009 | Tamboli | C11D 3/2075 510/175 |
| 2013/0045597 A1 | 2/2013 | Kamada et al. | |
| 2015/0045277 A1 | 2/2015 | Liu et al. | |
| 2016/0010035 A1 | 1/2016 | Liu et al. | |
| 2016/0020087 A1* | 1/2016 | Liu | C11D 3/2075 510/175 |
| 2016/0137953 A1 | 5/2016 | Lee et al. | |
| 2016/0340623 A1 | 11/2016 | Sun et al. | |

FOREIGN PATENT DOCUMENTS

| | | |
|---|---|---|
| CN | 105862044 | 8/2016 |
| EP | 1310989 | 5/2003 |
| KR | 2013092096 | 8/2013 |
| WO | 2005/042658 | 5/2005 |
| WO | 2016/111990 | 7/2016 |

OTHER PUBLICATIONS

Ramachandran, M. et al; "Hybrid Cleaning Technology for Enhanced Post-Cu/Low-Dielectric Constant Chemical Mechanical Planarization Cleaning Performance"; Japanese Journal of Applied Physics 52 (2013); May 20, 2013.

* cited by examiner

*Primary Examiner* — Gregory E Webb
(74) *Attorney, Agent, or Firm* — Entegris, Inc.

(57) ABSTRACT

A removal composition and process for cleaning post-chemical mechanical polishing (CMP) contaminants and particles from a microelectronic device having said particles and contaminants thereon. The removal compositions include at least one at least one organic additive; at least one metal chelating agent; and at least one polyelectrolyte. The composition achieves highly efficacious removal of the particles and CMP contaminant material from the surface of the microelectronic device without compromising the low-k dielectric, silicon nitride, and metal containing layers such as tungsten-containing layers.

17 Claims, No Drawings

TUNGSTEN POST-CMP CLEANING COMPOSITION

RELATED APPLICATION

This application is filed under the provisions of 35 U.S.C. § 371 claiming priority of International Patent Application No. PCT/US2017/021624 filed on Mar. 9, 2017, which further claims the benefit of U.S. Provisional Application No. 62/305,781 filed on Mar. 9, 2016 entitled "Post-CMP Composition and Method of Using Same", the entirety of which is incorporated herein by reference for all purposes.

TECHNICAL FIELD

The present disclosure relates to removal compositions and processes for cleaning post-chemical mechanical polishing (CMP) contaminants and particles from a microelectronic device having said particles and contaminants thereon. More particularly, the present disclosure relates to post CMP cleaning compositions and processes that remove particles and other CMP contaminant material from the surface of the microelectronic device without compromising the barrier layers, dielectric layers, and tungsten containing layers.

BACKGROUND

Microelectronic device wafers are used to form integrated circuits. The microelectronic device wafer includes a substrate, such as silicon, into which regions are patterned for deposition of different materials having insulative, conductive or semi-conductive properties. To obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (more specifically, planarized) by coupling a physical process such as abrasion with a chemical process such as oxidation or chelation. In its most rudimentary form, CMP involves applying slurry, e.g., a solution of an abrasive and an active chemistry, to a polishing pad that buffs the surface of a microelectronic device wafer to achieve the removal, planarization, and polishing processes. It is not desirable for the removal or polishing process to be comprised of purely physical or purely chemical action, but rather the synergistic combination of both in order to achieve fast, uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing.

Following CMP processing, particles, residue and other contaminants may be present on the surface of the microelectronic device. Towards that end, post-CMP removal compositions have been developed to remove the post-CMP residue, particles, and contaminants.

A need remains in the art for a particle removal composition and process that effectively removes particles from a surface of a microelectronic device while not damaging the underlying materials such as silicon nitride, low-k dielectrics, and conductive metal layers, particularly tungsten-containing layers.

SUMMARY

The present disclosure relates to removal compositions and processes for cleaning post-chemical mechanical polishing (CMP) contaminants and particles from a microelectronic device having said particles and contaminants thereon. More particularly, the present disclosure relates to post CMP cleaning compositions and processes that remove particles and other CMP contaminant material from the surface of the microelectronic device without compromising the barrier layers, dielectric layers, and tungsten containing layers.

According to various embodiments, a post-CMP removal composition can include: at least one organic additive; at least one metal chelating agent; and at least one polyelectrolyte such that when the composition is brought into contact with a microelectronic comprising tungsten containing layers and having metal particles and contaminants present on a surface of the microelectronic device that are a result of a chemical mechanical polishing process step, the composition at least partially removes metal particles and contaminants present on the surface of the microelectronic device without substantially corroding any tungsten containing layers.

In other embodiments, a method can include contacting a surface of a microelectronic device comprising a tungsten containing material and having particles and CMP contaminants present on a surface thereof with a removal composition including at least one organic additive; at least one metal chelating agent; and at least one polyelectrolyte for sufficient time to at least partially remove the particles and contaminants from the surface of the microelectronic device, wherein the removal composition does not substantially remove the tungsten from the microelectronic device.

In some embodiments, the organic additive can include monoethanolamine, ascorbic acid, 2-(2-aminoethoxy)ethanol, and combinations thereof.

In some embodiments, the chelating agent can include deferoxamine mesylate salt, lignosulfonic acid, -{2-{Bis (carboxymethyl)amino]ethyl}-N-(2-hydroxyethyl)glycine (HEDTA), a 50:50 mixture of glycine and gluconic acid, acetohydroxamic acid, carnitine, glutamic acid, tris(2-aminoethyl)amine, 3-hydroxy-1, 2-dimethyl-4(1H)pyridone, L-cysteine, thioglycolic acid, oxalic acid, 1,2-cyclohexanediamine-N,N,N',N'-tetraacetic acid (CDTA), 1,2-dihydroxybenzene-3,5-disulfonate, citric acid, succinic acid, maleic acid, maleic anhydride, ethylenediaminetetraacetic acid (EDTA), 1-Hydroxyethane-1,1,-diphosphonic acid (HEDP), phosphoric acid, and combinations thereof.

In some embodiments, the polyelectrolyte can include alginic acid, carboxymethylcellulose, dextran sulfate, poly (galacturonic acid), homopolymers or copolymers of (meth) acrylic acid, poly(acrylic acid), styrene sulfonic acid, vinyl sulfonic acid, allyl sulfonic acid, acrylamidopropyl sulfonic acid, chitosan, cationic starch, polylysine, homopolymers or copolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid, 7-amino-3,7-dimethyloctyl (meth) acrylate acid, N,N'-dimethylaminopropyl acrylamide acid, allylamine, diallylamine, vinylamine (obtained by hydrolysis of vinyl alkylamide polymers), vinyl pyridine, salts thereof, and combinations thereof. In one embodiment, the polyelectrolyte can be poly(acrylic) acid.

In still other embodiments, the composition can include a pH adjustor. In some cases, the pH adjustor can include choline hydroxide, potassium hydroxide or tetraethyl ammonium hydroxide.

In some embodiments, the removal composition can have a pH ranging from about 2 to less than about 5.9 and may not include a surfactant.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

DESCRIPTION

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "particles" may be of any suitable type, including, without limitation, oxides, metal oxides, silicon nitrides, carbides, etc. Specific examples include silica, alumina, silicon carbide, silicon nitride, iron oxide, ceria, zirconium oxide, tin oxide, titanium dioxide, and mixtures of two or more of such components in suitable form, such as grains, granules, particles, or other divided form. Alternatively, the particles can include composite particles formed of two or more materials, Alumina is a preferred inorganic abrasive and can be employed in the form of boehmite or transitional δ, θ or γ phase alumina. Organic polymer particles, e.g., including thermoset and/or thermoplastic resin(s), can be utilized as abrasives. Useful resins in the broad practice of the present disclosure include epoxies, urethanes, polyesters, polyamides, polycarbonates, polyolefins, polyvinylchloride, polystyrenes, polyolefins, and (meth)acrylics. Mixtures of two or more organic polymer particles can be used as the abrasive medium, as well as particles comprising both inorganic and organic components. When the particles are ceria particles, the ceria particles may comprise, consist of, or consist essentially of cerium oxide such as $Ce_2O_3$ and $CeO_2$.

As used herein, "contaminants" correspond to chemicals present in the CMP slurry, reaction by-products of the polishing slurry, post-CMP residue, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., chemicals present in the slurry, reaction by-products of the polishing slurry, carbon-rich particles, polishing pad particles, brush deloading particles, equipment materials of construction particles, metal, organic residues, and any other materials that are the by-products of the CMP process. In addition, if tungsten was removed during the CMP process, the post-CMP residue can further comprise tungsten-containing particles.

As defined herein, "low-k dielectric material" corresponds to any material used as a dielectric material in a layered microelectronic device, wherein the material has a dielectric constant less than about 3.5. Preferably, the low-k dielectric materials include, but are not limited to, low-polarity materials such as silicon-containing organic polymers, silicon-containing hybrid organic/inorganic materials, organosilicate glass (OSG), TEOS, fluorinated silicate glass (FSG), silicon dioxide, silicon dioxide prepared from TEOS, thermal oxide, silicon carbide, silicon oxycarbide, silicon carbonitride, and carbon-doped oxide (CDO) glass. It is to be appreciated that the low-k dielectric materials may have varying densities and varying porosities.

"Substantially devoid" is defined herein as less than 2 wt. %, preferably less than 1 wt. %, more preferably less than 0.5 wt. %, and most preferably less than 0.1 wt. %. "Devoid" is intended to correspond to less than 0.001 wt. % to account for environmental contamination.

As used herein, "oxidizing agents" correspond to compounds that oxidize exposed metal(s) resulting in corrosion of the metal or oxide formation on the metal.

As used herein, "fluoride containing compounds" correspond to salt or acid compound comprising a fluoride ion ($F^-$) that is ionically bonded to another atom.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, and other refractory metals and their nitrides and silicides.

As used herein, "suitability" or "suitable" for removing particles and CMP contaminants from a microelectronic device having said particles and contaminants thereon corresponds to at least partial removal of said particles/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{(\text{Number of PreClean Objects} - \text{Number of PostClean Objects})}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest.

One skilled in the art would readily understand that the less area covered by said areas of interest post-cleaning, the more efficacious the removal composition. Preferably, at least 75% of the particles/contaminants are removed from the microelectronic device using the compositions described herein, more preferably at least 90%, even more preferably at least 95%, and most preferably at least 99% of the particles/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.00001 weight percent, based on the total weight of the composition in which such components are employed.

The present disclosure generally relates to a post-CMP removal compositions and processes for cleaning particles, residue and CMP contaminants from microelectronic devices having said particles, residue and CMP contaminants thereon. The compositions described herein may have utility in applications including, but not limited to, post-etch residue removal, post-ash residue removal surface preparation, post-plating cleaning and post-CMP residue removal. The post-CMP compositions and processes, disclosed herein, do not substantially damage materials such as silicon nitride, low-k dielectrics (e.g., silicon oxide), and conductive metal layers, particularly tungsten-containing layers. In preferred embodiments, the post-CMP removal compositions described herein are formulated to remove particles, residue and other CMP contaminants from a microelectronic device while at the same time exhibiting substantially no tungsten or titanium nitride corrosion. The post-CMP removal compositions described herein exhibit a low tungsten etch rate of less than 2 Å/min, a titanium nitride etch rate of less than 1 Å/min, and a dielectric etch rate of less than 1 Å/min.

In each embodiment, disclosed herein, the post-CMP removal composition can be substantially devoid of at least one of oxidizing agents; fluoride-containing sources; chemical mechanical polishing abrasive materials (e.g., silica, alumina, etc.) prior to contact with a microelectronic device; alkali and/or alkaline earth metal bases; and corrosion inhibitors selected from the group consisting of cyanuric acid, barbituric acid and derivatives thereof, glucuronic acid, squaric acid, alpha-keto acids, adenosine and derivatives thereof, ribosylpurines and derivatives thereof, purine compounds and derivatives thereof, degradation products of adenosine and adenosine derivatives, triaminopyrimidine and other substituted pyrimidines, purine-saccharide complexes, phosphonic acid and derivatives thereof, phenanthroline, glycine, nicotinamide and derivatives thereof, flavonoids such as flavonols and anthocyanins and derivatives thereof, and combinations thereof, prior to removal of residue material from the microelectronic device. In addition, the removal compositions should not solidify to form a polymeric solid, for example, photoresist.

In many embodiments, the post-CMP removal composition is an aqueous composition.

The removal compositions, as disclosed herein according to the various embodiments, can include an organic additive. An organic additive, as used herein, can be any molecule capable of forming a complexed structure with individual atoms/molecules/materials. The new structures can be formed either via single or multiple reaction centers. Suitable organic additives can include species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl (e.g., methyl, ethyl, propyl, butyl, pentyl, and hexyl), straight-chained or branched $C_1$-$C_6$ alcohol (e.g., methanol, ethanol, propanol, butanol, pentanol, and hexanol), and straight chained or branched ethers having the formula $R^4$—O—$R^5$, where $R^4$ and $R^5$ may be the same as or different from one another and are selected from the group consisting of $C_1$-$C_6$ alkyls as defined above. Most preferably, at least one of $R^1$, $R^2$ and $R^3$ is a straight-chained or branched $C_1$-$C_6$ alcohol. Examples of $NR^1R^2R^3$ amines include, without limitation, alkanolamines such as aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, isopropanolamine, diisopropanolamine, 2-amino-1-butanol, 2-amino-2-ethyl-1,3-propanediol, 2-amino-2-methyl-1,3-propanediol, other $C_1$-$C_8$ alkanolamines and combinations thereof. When the amine includes the ether component, the amine may be considered an alkoxyamine, e.g., 1-methoxy-2-aminoethane.

Alternatively, or in addition to the $NR^1R^2R^3$ amine, the organic additive can be a multi-functional amine including, but not limited to, 2-(2-aminoethoxy)ethanol, morpholine, N-methylmorpholine, 4-(2-hydroxyethyl)morpholine (HEM), aminomethylpiperazine, N-aminoethylpiperazine (N-AEP), thiourea, 1,1,3,3-tetramethylurea, urea, saccharin, urea derivatives, uric acid, alanine, arginine, asparagine, aspartic acid, glutamic acid, glutamine, histidine, isoleucine, leucine, lysine, methionine, phenylalanine, proline, serine, threonine, tryptophan, tyrosine, valine, glycine, cysteine, acetyl cysteine, tris(hydroxymethyl)-aminomethane, isopropyl hydroxylamine, ethyl hydroxylamine, propyl hydroxylamine, methyl hydroxylamine, hydroxylamine, and combinations thereof.

Alternatively, or in addition to the $NR^1R^2R^3$ amine and/or the multi-functional amine, the organic additive can include organic acids comprising at least one COOH group or carboxylate group in a salt thereof, including, but not limited to, lactic acid, dimethylolproionic acid, gluconic acid, glyceric acid, formic acid, acetic acid, propionic acid, acrylic acid, adipic acid, itaconic acid, pyrocatechol, pyrogallol, tannic acid, ascorbic acid, other aliphatic and aromatic carboxylic acids, salts thereof as well as combinations of the foregoing acids.

In some embodiments, the at least one organic additive includes any one of monoethanolamine, 2-(2-aminoethoxy) ethanol, and combinations thereof.

Alternatively or in addition to an organic additive, the aqueous removal compositions, as contemplated herein according to the various embodiments, can also include a metal chelating agent. A metal chelating agent is a ligand that contains more than one donor atom, e.g. an atom with a lone pair of electrons. The lone pairs of electrons are donated/shared with the empty electron orbitals of a metal, thus forming a "chelate". Chelate ligands are bidentate in the least, but may be tri-, tetra-, penta-, hexa- and polydentate. The metal chelating agents are added to the cleaning composition to bind to any metal particles present on the surface and to retain the metal particles in the aqueous phase so that they may be easily rinsed away during the cleaning process.

The metal chelating agent can include at least two different types of functional groups. The first type of functional group increases the solubility of the agent. The second functional group binds to the metal. In some cases, the second functional group is selected such that it easily binds to iron particles present on the microelectronic device following a CMP step. Regardless of the functional groups, the metal chelating agents should be functionalized such that the complex formed between the targeted metal particle and the metal chelating agent is soluble in an aqueous environment. Cleaning compositions including a metal chelating agent exhibit higher levels of metal particle removal than compositions that do not include a metal chelating agent. In some embodiment, the chelating agent is selected for its ability to bind to and solubilize iron containing particles such as, for example, iron oxide particles that may be present on the surface of the microelectronic device. In some embodiments, the metal chelating agent is an iron chelating agent selected for is ability to bind to and solubilize iron containing particles.

Exemplary metal chelating agents that can be included in the post CMP cleaning composition can include, but are not limited to: deferoxamine mesylate salt, lignosulfonic acid, -{2-{Bis(carboxymethyl)amino]ethyl}-N-(2-hydroxyethyl) glycine (HEDTA), a 50:50 mixture of glycine and gluconic acid, acetohydroxamic acid, salicylhydroxamic acid, carnitine, glutamic acid, tris(2-aminoethyl)amine, 3-hydroxy-1,2-dimethyl-4(1H)pyridone, L-cysteine, thioglycolic acid, oxalic acid, citric acid, succinic acid, benzoic acid, fumaric acid, malonic acid, mandelic acid, maleic acid, maleic anhydride, phthalic acid, glutaric acid, glycolic acid, glyoxylic acid, itaconic acid, phenylacetic acid, quinic acid, pyromellitic acid, tartaric acid, terephthalic acid, trimellitic acid, trimesic acid, 1,2-cyclohexanediamine-N,N,N',N'-tetraacetic acid (CDTA), 1-Hydroxyethane-1,1,-diphosphonic acid (HEDP), ethylenediaminetetraacetic acid (EDTA), m-xylenediamine (MXDA), iminodiacetic acid (IDA), 2-(hydroxyethyl)iminodiacetic acid (HIDA), diethylene triamine pentaacetic acid, nitrilotriacetic acid, tartaric acid, terephthalic acid, pyrocatechol, 1,2-dihydroxybenzene-3,5-disulfonate (Tiron), and combinations thereof.

Alternatively, or in addition to the other recited chelating agents disclosed herein, the chelating agent can include phosphoric acid or phosphonic acid and derivatives thereof such as, for example, 1,5,9-triazacyclododecane-N,N',N"-tris(methylenephosphonic acid) (DOTRP), 1,4,7,10-tetraazacyclododecane-N,N,N",N"-tetrakis(methylenephosphonic acid) (DOTP), nitrilotris(methylene)triphosphonic acid, diethylenetriaminepenta(methylenephosphonic acid) (DETAP), aminotri(methylenephosphonic acid) (ATMP), diethylenetriamine penta(methylene phosphonic acid) (DTMP), 1-hydroxyethylidene-1,1-diphosphonic acid (HEDP), bis(hexamethylene)triamine phosphonic acid, 1,4,7-triazacyclononane-N,N',N"-tris(methylenephosphonic acid) (NOTP), and combinations thereof.

In one embodiment, the chelating agent can be any one of deferoxamine mesylate salt, lignosulfonic acid, -{2-{Bis(carboxymethyl)amino]ethyl}-N-(2-hydroxyethyl)glycine (HEDTA), a 50:50 mixture of glycine and gluconic acid, acetohydroxamic acid, carnitine, glutamic acid, tris(2-aminoethyl)amine, 3-hydroxy-1, 2-dimethyl-4(1H)pyridone, L-cysteine, thioglycolic acid, oxalic acid, 1,2-dihydroxybenzene-3,5-disulfonate, and combinations thereof. In another embodiment, the chelating agent can be citric acid or ascorbic acid. In still other embodiments, the chelating agent can be 1,2-cyclohexanediamine-N,N,N',N'-tetraacetic acid (CDTA).

In some embodiments, the pH of the composition can be adjusted to a desired pH by the inclusion of a pH adjustor in the composition. The pH of the composition should be adjusted such that is in a range suitable for the intended application. For tungsten applications, it has been determined that a slightly acidic pH is preferred as tungsten begins to etch at higher pH levels. In some case, the pH of the composition is less than about 7 and more particularly, less than about 6. In some embodiments, the pH of the composition ranges from about 2 to less than 8; from about 2 to less than about 7; from 2 to less than about 6; from about 2 to less than 5.9; from about 2 to about 5.7; from about 2 to about 5.5; from about 2 to about 5.3; from about 2 to about 5; and from about 2 to less than 5. In one embodiment, a suitable amount of the pH adjustor can be added to the composition such that the pH of the composition is about 5.6. In another embodiment, a suitable amount of the pH adjustor can be added to the composition such that the pH of the composition is about 5.8.

pH adjusters contemplated herein include compounds having the formula $NR'R^2R^3R^4OH$ and/or $(PR'R^2R^3R^4)OH$, wherein R', $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl. Exemplary tetraalkylammonium hydroxides include, but are not limited to, tetraethylammonium hydroxide (TEAH), tetramethylammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), ETAH, methyl(trishydroxyethyl)ammonium hydroxide, tetrabutylphosphonium hydroxide (TBPH), ethyltrimethylammonium hydroxide (ETMAH), methyltriethylammonium hydroxide (MTEAH), and combinations thereof. Exemplary tetraalkylphosphnium hydroxides suitable for use as a pH adjustor can include, but are not limited to, tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, and combinations thereof. Tetraalkylammonium hydroxides which are not commercially available may be prepared in a manner analogous to the published synthetic methods used to prepare TMAH, TEAH, TPAH, TBAH, TBMAH, and BTMAH, which are known to one ordinary of skill in the art.

Alternatively or in addition to the tetraakylammonium hydroxides and/or the tetraalkylphosphnium hydroxides discloses here, the pH adjustor can include potassium hydroxide, citric acid, sulfuric acid, phosphoric acid, nitric acid, cesium hydroxide, choline hydroxide, and combinations thereof.

In some embodiments, the pH adjustor is a quaternary ammonium base. In one embodiment, the pH adjustor can be any of tetraethylammonium hydroxide (TEAH), tetramethylammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), ethyltriethyl ammonium hydroxide (ETAH), methyl(trishydroxyethyl)ammonium hydroxide, tetrabutylphosphonium hydroxide (TBPH), ethyltrimethylammonium hydroxide (ETMAH), or combinations thereof. In another embodiment, the quaternary ammonium base is choline hydroxide.

In preferred embodiments, the pH adjustor can be any one of choline hydroxide, potassium hydroxide, or tetraethylammonium hydroxide.

Depending on the manufacturer's environmental requirements, the compositions can be substantially devoid of TMAH, when required. Additionally, in some cases, it will be recognized by those of skill in the art that certain organic additives can also act as a pH adjustor.

In various embodiments, the post-CMP removal composition can include water and/or at least one water-miscible organic solvent. The solvent can be any one of methanol, ethanol, isopropanol, butanol, pentanol, hexanol, 2-ethyl-1-hexanol, heptanol, octanol, ethylene glycol, propylene glycol, 2-propoxybutanol, 2-propoxyphenol, butylene glycol, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, methyl isobutyl ketone (MIBK), methyl ethyl ketone, 6-heptene-2-one, 2,4-hexanedione, 1-phenyl-1-propanone, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, dimethylsulfoxide, sulfolane, methylsulfonylmethane, acetic acid, acetic anhydride, trifluoroacetic acid, N-methylpyrrolidone, N-ethylpyrrolidone, dense fluid, and combinations thereof.

In some embodiments, the solvent can include water, propylene glycol n-butyl ether, and any combination thereof. In other embodiments, the solvent can include water, 2-propoxybutanol, 2-propoxyphenol, and combinations thereof. In one embodiment, the solvent can include water, preferably deionized water. In many embodiments, the post-CMP removal composition is an aqueous composition, wherein the balance of the composition is water.

In some embodiments, the removal composition can include a reducing agent. The reducing agents, when present, include, but are not limited to, ascorbic acid, L(+)-ascorbic acid, isoascorbic acid, ascorbic acid derivatives, gallic acid, glyoxal, sulfurous acid, ammonium sulfite, potassium sulfite, sodium sulfite, dopamine HCl, phosphorous acid, phosphinic acid, potassium metabisulfite, sodium metabisulfite, ammonium metabisulfite, hydroxylamine, galactose, ribose, arabinose, xylose, fucose, rhamnose, mannose, fructose, sorbose, galacturonic acid, glucosamine, maltose, lactose, potassium pyruvate, sodium pyruvate, ammonium pyruvate, formic acid, sodium formate, potassium formate, ammonium formate, dopamine, sulfur dioxide solution, ammonium sulfite, phosphinic acid and combinations thereof. In one embodiment, the reducing agent can be ascorbic acid. In another embodiment, the cleaning composition can include ascorbic acid and/or gallic acid.

The post-CMP removal composition can include nonionic, anionic, cationic and/or zwitterionic polymers which may behave as a polyelectrolyte at neutral pH. Anionic polymers or anionic polyelectrolytes can be natural, modified natural polymers or synthetic polymers. Exemplary natural and modified natural anionic polymers that can be included in the aqueous removal composition include, but are not limited to: alginic acid (or salts), carboxymethylcellulose, dextran sulfate or poly(galacturonic acid) or salts thereof. Exemplary synthetic anionic polyelectrolytes that can be included in the aqueous removal composition can include, but are not limited to: homopolymers or copolymers of (meth)acrylic acid (or salts), poly(acrylic acid), maleic acid (or anhydride), styrene sulfonic acid (or salts), vinyl sulfonic acid (or salts), allyl sulfonic acid (or salts), acrylamidopropyl sulfonic acid (or salts), and the like, wherein the salts of the said carboxylic acid and sulfonic acids are preferably neutralized with an ammonium or alkylammonium cation. Preferred cations of the polyelectrolyte anionic polymer are ammonium cations (NH4+), cholinium+N(CH3)3(CH2CH2OH) and +N(CH3)4. Thus, the preferred combined synthetic and natural polyelectrolyte anionic polymers are homopolymers or copolymers of (meth)acrylic acid, maleic acid (or anhydride), styrene sulfonic acid, vinyl sulfonic acid, allyl sulfonic acid, acrylamidopropyl sulfonic acid, alginic acid, carboxymethylcellulose, dextran sulfate or poly(galacturonic acid) or salts thereof. Cationic polymers and cationic polyelectrolytes can be natural, modified natural polymers or synthetic polymers. Exemplary natural and modified natural cationic polymers that can be include in the aqueous removal composition include, but are not limited to: chitosan, cationic starch, polylysine and salts thereof. Exemplary cationic synthetic polyelectrolytes that can be included in the aqueous removal composition include but are not limited to: homopolymers or copolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternized salts, wherein the quaternary salts include alkyl and benzyl quaternized salts; allylamine, diallylamine, vinylamine (obtained by hydrolysis of vinyl alkylamide polymers), vinyl pyridine, chitosan, cationic starch, polylysine and salts thereof. In one embodiment, the polyelectrolyte can be poly(acrylic acid).

In some embodiments, the post-CMP removal composition can include a surfactant. However, for tungsten post CMP cleaning applications, the aqueous removal composition does not require and more particularly, does not include a surfactant.

In some embodiments, the post-CMP removal compositions can further include at least one corrosion inhibitor. The corrosion inhibitor component is added to the aqueous cleaning composition to lower the corrosion rate of metals. Corrosion inhibitors contemplated include, but are not limited to benzotriazole, citric acid, ethylenediamine, tannic acid, 1,2,4-triazole (TAZ), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1,2,3-triazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthothiazole, 2-mercaptobenzimidazole (MBI), 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indazole, benzoic acid, ammonium benzoate, catechol, pyrogallol, resorcinol, hydroquinone, propanethiol, benzohydroxamic acids, potassium ethylxanthate, poly(acrylamide-co-diallyldimethylammonium chloride), malic acid, oxalic acid, phenylalanine, cysteine, cinnamic acid, 1,10-phenanthroline, benzalkonium chloride, poly((2-dimethylamino)ethyl methacrylate) methyl chloride quaternary salt, dodecyl trimethyl ammonium chloride, polyetheramines, dioctyl phenylphosphonate, lauroyl sarcosine, p-toluenesulfonic acid and combinations thereof.

In some embodiments, for post CMP cleaning applications targeting tungsten, the removal composition can include a corrosion inhibitor for inhibiting the corrosion of tungsten. The inclusion of a tungsten specific corrosion inhibitor may be needed when the composition has a pH greater than 6. Tungsten specific corrosion inhibitors that can be included in the aqueous removal composition include, but are not limited to: poly(diallyldimethylammonium chloride), polyethyleneimine, poly(acrylamide-co-diallyldimethylammonium chloride), malic acid, oxalic acid, phenylalanine, cysteine, cinnamic acid, 1,10-phenanthroline, benzalkonium chloride, (C12-C16) alkyltrimethylammonium chloride, C12-C16 alkylamines, poly(2-dimethylamino)ethyl methacrylate) methyl chloride quaternary salt and copolymers, dodecyl trimethyl ammonium chloride, polyetheramines, dioctyl phenylphosphonate, lauroyl sarcosine, p-toluenesulfonic acid and combinations thereof. However, in embodiments where the aqueous removal composition has a pH of less than about 6 and more particularly, less than about 5.9, a tungsten corrosion inhibitor is not required as tungsten forms a protective surface layer composed mainly of tungsten oxide ($WO_3$), which possesses self-corrosion inhibiting properties. In other words, in some embodiments, where the pH of the aqueous composition is less than 6, the aqueous removal composition does not include a corrosion inhibitor. When present, the amount of corrosion inhibitor can range from about 0.0001 wt % to about 2 wt %, and more particularly form about 0.01 wt % to about 1 wt %, based on the total weight of the composition. In one embodiment, when present, the amount of corrosion inhibitor include in the aqueous removal composition can be about 0.05 wt %, based on the total weight of the composition.

In some embodiments, the post-CMP removal composition can include a biocide. Exemplary biocides contemplated herein include, but are not limited to, isothiazolinone biocides such as 5-chloro-2-methyl-4-isothiazolin-3-one, 2-methyl-4-isothiazolin-3-one, benzisothiazolone, 1, 2-benzisothiazol-3[2H]-one, methylisothiazolinone, methylchloroisothiazolinone, and combinations thereof. Alternatively, or in addition to, the biocide can include 2-bromo-2-nitropropane-1,3-diol.

In one preferred embodiment, the post-CMP removal composition can include 2-(2-aminoethoxy)ethanol, citric acid, poly(acrylic acid), choline hydroxide, and water and has a pH ranging from about 3 to less than 5.9. In another preferred embodiment, the post-CMP removal composition can include water, choline hydroxide, ascorbic acid, citric acid, poly(acrylic acid) and has a pH ranging from about 3 to less than 5.9. In yet another preferred embodiment, the removal composition can include or 2-(2-aminoethoxy)ethanol, citric acid, poly(acrylic acid), and water. In some embodiments, each of these preferred compositions can include a metal chelating agent. Preferred metal chelating agents can include deferoxamine mesylate salt, lignosulfonic acid, -{2-{Bis(carboxymethyl)amino]ethyl}-N-(2-hydroxyethyl)glycine (HEDTA), a 50:50 mixture of glycine and gluconic acid, acetohydroxamic acid, carnitine, glutamic acid, tris(2-aminoethyl)amine, 3-hydroxy-1, 2-dimethyl-4(1H)pyridone, L-cysteine, thioglycolic acid, oxalic acid, 1,2-cyclohexanediamine-N,N,N',N'-tetraacetic acid (CDTA), 1,2-dihydroxybenzene-3,5-disulfonate (Tiron), and combinations thereof.

With regards to compositional amounts, in one embodiment, the weight percent ratios of each component is preferably as follows: about 0.1:1 to about 50:1 organic additive(s) to pH adjuster(s), preferably about 0.5:1 to about 20:1, and most preferably about 0.5:1 to about 10:1; about 0.01:1 to about 30:1 corrosion inhibitor(s) (when present) to pH adjuster(s), preferably about 0.1:1 to about 10:1, and most preferably about 0.1:1 to about 5:1; about 0.001:1 to about 20:1 surfactant(s) and/or polymer(s) (when present) to pH adjuster(s), preferably about 0.01:1 to about 10:1, and most preferably about 0.05:1 to about 1:1; and about 0.1:1 to about 30:1 reducing agent(s) (when present) to pH adjuster(s), preferably about 0.5:1 to about 10:1, and most preferably about 0.5:1 to about 5:1. In another embodiment, the weight percent ratios of each component is preferably as follows: about 10:1 to about 100:1 organic additive(s) to surfactant(s) and/or polymer(s), preferably about 30:1 to about 80:1, and most preferably about 35:1 to about 75:1; about 10:1 to about 150:1 organic additive(s) to corrosion inhibitor(s) (when present), preferably about 40:1 to about 100:1; and about 1:1 to about 50:1 organic additive(s) to reducing agent(s) (when present), preferably about 1:1 to about 30:1.

The range of weight percent ratios of the components will cover all possible concentrated or diluted embodiments of the composition. Towards that end, in one embodiment, a concentrated removal composition is provided that can be diluted for use as a cleaning solution. A concentrated composition, or "concentrate," advantageously permits a user, e.g. CMP process engineer, to dilute the concentrate to the desired strength and pH at the point of use. Dilution of the concentrated aqueous removal composition may be in a range from about 1:1 to about 2500:1, preferably about 5:1 to about 200:1, and most preferably about 10:1 to about 70:1, wherein the aqueous removal composition is diluted at or just before the tool with solvent, e.g., deionized water. It is to be appreciated by one skilled in the art that following dilution, the range of weight percent ratios of the components disclosed herein should remain unchanged.

The post-CMP removal compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another embodiment relates to a kit including, in one or more containers, one or more components adapted to form the compositions described herein. The kit may include, in one or more containers, at least one pH adjuster and/or at least one organic additive as well as at least one solvent, and optionally at least one surfactant and/or polymer, optionally at least one corrosion inhibitor, optionally at least one reducing agent, and optionally at least one biocide, for combining with additional solvent, e.g., water, at the fab or the point of use.

As applied to microelectronic manufacturing operations, the aqueous removal compositions described herein are usefully employed to clean particles and/or CMP contaminants (e.g., post-CMP residue and contaminants) from the surface of the microelectronic device. The aqueous removal compositions do not damage low-k dielectric materials (e.g., silicon oxide), silicon nitride layers, and conductive metal layers such as tungsten-containing layers on the device surface. Preferably the aqueous removal compositions remove at least 85% of the particles present on the device prior to particle removal, more preferably at least 90%, even more preferably at least 95%, and most preferably at least 99%.

In post-CMP particle and contaminant removal application, the aqueous removal composition may be used with a large variety of conventional cleaning tools such as megasonics and brush scrubbing.

In use of the compositions described herein for removing particles and/or CMP contaminants from microelectronic devices having same thereon, the aqueous, post-CMP removal composition typically is contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially remove the particles and/or CMP contaminants from the device, within the broad practice of the method. "At least partially clean" and "substantial removal" both correspond to at removal of at least 85% of the particles present on the device prior to particle removal, more preferably at least 90%, even more preferably at least 95%, and most preferred at least 99%

Following the achievement of the desired particle removal action, the aqueous removal composition may be readily removed from the device to which it has previously been applied, as may be desired and efficacious in a given end use application of the compositions described herein. Preferably, the rinse solution includes deionized water. Thereafter, the device may be dried using nitrogen or a spin-dry cycle.

EXAMPLES

Example 1

The following solutions shown in Table 1 were prepared prior to etch rate, zeta potential, and full-wafer experiments. CVD W substrates were submerged, at 30° C., in undiluted control and formulations A-F (diluted according to Table 1) to determine etch rate. Formulation A included 6 wt. % citric acid (32 wt. % in $H_2O$), 2.4 wt. % ascorbic acid, 0.16 wt. % poly(acrylic acid) (~2,000 MW 50 wt. % in $H_2O$), 9.46 wt. % pH adjuster, balance water. Formulations B-F included 9.375 wt. % citric acid (32 wt. % in $H_2O$) with varying percentages of the 2-(2-aminoethoxy)ethanol, poly(acrylic acid), and pH adjuster, balance water. Formulations A-F show W etch rates below ≤1.207 Å/min. compared to the Ammonia control (19.06 Å/min.).

Example 2

Formulation D included 9.375 wt. % citric acid (32 wt. % in $H_2O$), 3 wt. % 2-(2-aminoethoxy)ethanol, 0.202 wt. % poly(acrylic acid), 1.01 wt. % pH adjuster, and balance water. Formulation E, in comparison, included 9.375 wt. % citric acid (32 wt. % in $H_2O$), 3 wt. % 2-(2-aminoethoxy) ethanol, 1.01 wt. % pH adjuster, and balance water. Formulations D and E concentrates have a concentrate pH of 5 and both diluted with deionized prior to experimentation. An AMAT Reflexion LK Polishing Tool and a KLA SP-3 Defect Inspection Tool were used to determine the number of defects left on blanket W, $SiO_2$, and $Si_3N_4$ substrates.

The results show that formulation D and E have similar defects on blanket W substrate, but the removal of Poly (acrylic acid) in formulation E has a large negative effect on $SiO_2$ full-wafer defects, and an even larger negative effect on $Si_3N_4$ blanket substrates.

TABLE 1

| Formulations A-F | | | | | | | |
| --- | --- | --- | --- | --- | --- | --- | --- |
| Component (as added) | Control | A/wt % | B/wt % | C/wt % | D/wt % | E/wt % | F/wt % |
| DI Water | | 81.98 | 88.625 | 86.025 | 86.413 | 86.615 | 83.995 |
| Citric Acid (32 wt. % in H2O) | | 6 | 9.375 | 9.375 | 9.375 | 9.375 | 9.375 |
| Ascorbic Acid | | 2.4 | | | | | |
| 2-(2-aminoethoxy)ethanol | | | 1.9 | 4.5 | 3 | 3 | 4.5 |
| Poly (acrylic acid) ~2,000 MW (50 wt. % in H2O) | | 0.16 | 0.1 | 0.1 | 0.202 | 0 | 0.1 |
| pH Adjuster | | 9.46 | | | 1.01 | 1.01 | 2.03 |
| Dil. Ammonia (2850:1) | 100% | | | | | | |
| Conc. pH | | 5.6 | 4.02 | 5.8 | 5 | 5 | 8.75 |
| W Etch Rate (Å/min.) | 19.06 | 0.680002 | 0.736662 | 1.206665 | 0.969995 | 0.709993 | 1.07111 |
| Δ W Defect Count ≥ 0.1 μm | 35 | 29 | 178 | 36 | 114 | 121 | 214 |
| Δ SiO2 Defect Count ≥ 0.065 μm | 124 | 404 | 4690 | 195 | 849 | 5811 | 214 |
| Δ Si3N4 Defect Count ≥ 0.065 μm | 8892 | 149 | 7766 | 125 | 789 | 18977 | 2968 |

Example 3

The following solutions shown in Tables 2A and 2B were prepared and were diluted 100:1 with deionized water before experimentation. Formulation AA included 6 wt. % citric acid (32 wt. % in $H_2O$), 2.4 wt. % ascorbic acid 0.16 wt. % poly(acrylic acid) (~2,000 MW 50 wt. % in $H_2O$), 9.46 wt. % pH adjuster, and balance water. Formulation BB included 9.375 wt. % citric acid (32 wt. % in $H_2O$), 4.5 wt. %

2-(2-aminotheoxy)amine, 0.1 wt. % poly(acrylic acid) (~2,000 MW 50 wt. % in H$_2$O), balance water. Formulations CC-TT included 0.5 wt. % polyvinylpyrrolidone, and the rest of the components (specifically added for Fe chelation) listed in table 2. All formulations maintained pH levels from 4.5 to 5.8. The solutions were tested for their ability to remove Iron from PETEOS surfaces after exposure to a W slurry that contains 90 ppm of iron. ICP-OES and ICP-MS were used to determine the amount of Fe left on the surface.

TABLE 2A

Formulations AA-JJ

| Component (as added) | AA/wt % | BB/wt % | CC/wt % | DD/wt % | EE/wt % | FF/wt % | GG/wt % | HH/wt % | II/wt % | JJ/wt % |
|---|---|---|---|---|---|---|---|---|---|---|
| DI Water | 81.98 | 86.025 | 84.575 | 84.575 | 84.575 | 84.575 | 84.575 | 85.525 | 84.575 | 84.575 |
| Citric Acid (32 wt. % in H2O) | 6 | 9.375 | 9.375 | 9.375 | 9.375 | 9.375 | 9.375 | 9.375 | 9.375 | 9.375 |
| Ascorbic Acid | 2.4 | | | | | | | | | |
| 2-(2-aminoethoxy)ethanol | | 4.5 | 4.5 | 4.5 | 4.5 | 4.5 | 4.5 | 4.5 | 4.5 | 4.5 |
| Poly (acrylic acid) ~2,000 MW (50 wt. % in H2O) | 0.16 | 0.1 | 0.1 | 0.1 | 0.1 | 0.1 | 0.1 | 0.1 | 0.1 | 0.1 |
| Polyvinylpyrrolidone | | | 0.5 | 0.5 | 0.5 | 0.5 | 0.5 | 0.5 | 0.5 | 0.5 |
| Choline Hydroxide | 9.46 | | | | | | | | | |
| Deferoxamine mesylate salt | | | 0.95 | | | | | | | |
| Lignosulfonic acid, Mn = 7,000 | | | | 0.95 | | | | | | |
| HEDTA | | | | | | 0.95 | | | | |
| Glycine | | | | | | | 0.475 | | | |
| Gluconic acid | | | | | | | 0.475 | | | |
| Acetohydroxamic acid | | | | | | | | 0.95 | | |
| Carnitine | | | | | | | | | 0.95 | |
| Glutamic acid | | | | | | | | | | 0.95 |
| Tris(2-aminoethyl)amine | | | | | | | | | | 0.95 |
| Iron Remaining After Formulation Exposure (ppb) | 47 | 29.5 | 12 | 11.5 | 13 | 10 | 10 | 10.5 | 9 | 11 |

TABLE 2B

Formulations JJ-TT

| Component (as added) | KK/wt % | LL/wt % | MM/wt % | NN/wt % | OO/wt % | PP/wt % | QQ/wt % | RR/wt % | SS/wt % | TT/wt % |
|---|---|---|---|---|---|---|---|---|---|---|
| DI Water | 84.575 | 84.575 | 84.575 | 84.575 | 84.575 | 84.575 | 84.575 | 84.575 | 84.575 | 84.575 |
| Citric Acid (32 wt. % in H2O) | 9.375 | 9.375 | 9.375 | 9.375 | 9.375 | 9.375 | 9.375 | 9.375 | 9.375 | 9.375 |
| Ascorbic Acid | | | | | | | | | | |
| 2-(2-aminoethoxy)ethanol | 4.5 | 4.5 | 4.5 | 4.5 | 4.5 | 4.5 | 4.5 | 4.5 | 4.5 | 4.5 |
| Poly (acrylic acid) ~2,000 MW (50 wt. % in H2O) | 0.1 | 0.1 | 0.1 | 0.1 | 0.1 | 0.1 | 0.1 | 0.1 | 0.1 | 0.1 |
| Polyvinylpyrrolidone | 0.5 | 0.5 | 0.5 | 0.5 | 0.5 | 0.5 | 0.5 | 0.5 | 0.5 | 0.5 |
| 3-hydroxy-1,2-dimethyl-4(1H)pyridone | 0.95 | | | | | | | | | |
| Dequest 2010EG | | 0.95 | | | | | | | | |
| Dequest 2000EG | | | 0.95 | | | | | | | |
| Dequest 2060 | | | | 0.95 | | | | | | |
| L-Cysteine | | | | | 0.95 | | | | | |
| Thioglycolic acid | | | | | | 0.95 | | | | |
| oxalic acid | | | | | | | 0.95 | | | |
| Tiron | | | | | | | | 0.95 | | |
| CDTA | | | | | | | | | 0.95 | |
| DTPA | | | | | | | | | | 0.95 |
| Iron Remaining After Formulation Exposure (ppb) | 7.5 | 6 | 8 | 7 | 11.5 | 9 | 10.5 | 7.5 | 6.5 | 44.5 |

Although the disclosure has been variously disclosed herein with reference to illustrative embodiments and features, it will be appreciated that the embodiments and features described hereinabove are not intended to limit the disclosure, and that other variations, modifications and other embodiments will suggest themselves to those of ordinary skill in the art, based on the disclosure herein. The disclosure therefore is to be broadly construed, as encompassing all such variations, modifications and alternative embodiments within the spirit and scope of the claims hereafter set forth.

What is claimed is:

1. A composition comprising: at least one organic additive; at least one metal chelating agent; and at least one polyelectrolyte;
   wherein the at least one organic additive comprises a species selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, isopropanolamine, diisopropanolamine, 2-amino-1-butanol, 2-amino-2-ethyl-1,3-propanediol, 2-amino-2-methyl-1,3-propanediol, 1-methoxy-2-aminoethane, 2-(2-aminoethoxy)ethanol, morpholine, N-methylmorpholine, 4-(2-hydroxyethyl)morpholine (HEM), aminomethylpiperazine, and N-aminoethylpiperazine (N-AEP), and
   wherein when the composition is brought into contact with a microelectronic comprising tungsten containing layers and having metal particles and contaminants present on a surface of the microelectronic device that are a result of a chemical mechanical polishing process step, the composition at least partially removes metal particles and contaminants present on the surface of the microelectronic device without substantially corroding any tungsten containing layers.

2. The composition of claim 1, wherein the at least one organic additive comprises a species selected from a group consisting of monoethanolamine, ascorbic acid, and 2-(2-aminoethoxy)ethanol, and combinations thereof.

3. The composition of claim 1, wherein the at least one metal chelating agent comprises a species selected from the group consisting of deferoxamine mesylate salt, lignosulfonic acid, -{2-{Bis(carboxymethyl)amino]ethyl}-N-(2-hydroxyethyl)glycine (HEDTA), a 50:50 mixture of glycine and gluconic acid, acetohydroxamic acid, carnitine, glutamic acid, tris(2-aminoethyl)amine, 3-hydroxy-1, 2-dimethyl-4(1H)pyridone, L-cysteine, thioglycolic acid, oxalic acid, 1,2-cyclohexanediamine-N,N,N',N'-tetraacetic acid (CDTA), 1,2-dihydroxybenzen-3,5-di sulfonate, and combinations thereof.

4. A composition comprising: at least one organic additive; at least one metal chelating agent at least one pH adjustor; and at least one polyelectrolyte;
wherein the at least one organic additive comprises a species selected from the group consisting of aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, isopropanolamine, diisopropanolamine, 2-amino-1-butanol, 2-amino-2-ethyl-1,3-propanediol, 2-amino-2-methyl-1,3-propanediol, 1-methoxy-2-aminoethane, 2-(2-aminoethoxy)ethanol, morpholine, N-methylmorpholine, 4-(2-hydroxyethyl)morpholine (HEM), aminomethylpiperazine, N-aminoethylpiperazine (N-AEP), thiourea, 1,1,3,3-tetramethylurea, urea, saccharin, urea derivatives, uric acid, tris(hydroxymethyl)-aminomethane, isopropyl hydroxylamine, ethyl hydroxylamine, propyl hydroxylamine, methyl hydroxylamine, hydroxylamine, lactic acid, ascorbic acid, mandelic acid, benzoic acid, dimethylolproionic acid, glycolic acid, glyoxylic acid, itaconic acid, phenylacetic acid, quinic acid, gluconic acid, glyceric acid, formic acid, acetic acid, propionic acid, acrylic acid, adipic acid, pyrogallol, tannic acid, and combinations thereof, and
wherein the at least one pH adjuster comprises a species selected from the group consisting of tetraethylammonium hydroxide (TEAH), tetramethylammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), methyl (trishydroxyethyl)ammonium hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, choline hydroxide, and combinations thereof.

5. The composition of claim 1, wherein the pH adjustor comprise species selected from the group consisting of potassium hydroxide, citric acid, sulfuric acid, phosphoric acid, nitric acid, cesium hydroxide, choline hydroxide, and combinations thereof.

6. The composition of claim 1, wherein the pH adjustor comprises a species selected from the group consisting of choline hydroxide, potassium hydroxide, and tetraethylammonium hydroxide.

7. The composition of claim 1, wherein the composition does not include a surfactant.

8. The composition of claim 1, wherein the composition has a pH ranging from about 2 to less than about 5.9.

9. The composition of claim 8, wherein the composition does not include a corrosion inhibitor.

10. The composition of claim 1, further comprising at least one corrosion inhibitor, wherein the at least one corrosion inhibitor comprises a species selected from the group consisting of poly(diallyldimethylammonium chloride), polyethyleneimine, poly(acrylamide-co-diallyldimethylammonium chloride), malic acid, oxalic acid, phenylalanine, cysteine, cinnamic acid, 1,10-phenanthroline, benzalkonium chloride, (C12-C16) alkyltrimethylammonium chloride, C12-C16 alkylamines, poly(2-dimethylamino)ethyl methacrylate) methyl chloride quaternary salt and copolymers, dodecyl trimethyl ammonium chloride, polyetheramines, dioctyl phenylphosphonate, lauroyl sarcosine, p-toluenesulfonic acid and combinations thereof.

11. The composition of claim 1, wherein the polyelectrolyte comprises a species selected from the group consisting of alginic acid, carboxymethylcellulose, dextran sulfate, poly(galacturonic acid), homopolymers or copolymers of (meth)acrylic acid, poly (acrylic acid), maleic acid, maleic anhydride, styrene sulfonic acid, vinyl sulfonic acid, allyl sulfonic acid, acrylamidopropyl sulfonic acid, chitosan, cationic starch, polylysine, homopolymers or copolymers of diallyldimethyl ammonium chloride (DADMAC), diallyldimethyl ammonium bromide, diallyldimethyl ammonium sulfate, diallyldimethyl ammonium phosphates, dimethalldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid, 7-amino-3,7-dimethyloctyl (meth) acrylate acid, N,N'- dimethylaminopropyl acrylamide acid, allylamine, diallylamine, vinylamine (obtained by hydrolysis of vinyl alkylamide polymers), vinyl pyridine, salts thereof, and combinations thereof.

12. The composition of claim 1, further comprising the at least one biocide.

13. The composition of claim 1, further comprising an organic co-solvent.

14. A method comprising: contacting a surface of a microelectronic device comprising a tungsten containing material and having particles and CMP contaminants present on a surface thereof with the removal composition of claim 4 for sufficient time to at least partially remove the particles and contaminants from the surface of the microelectronic device, wherein the removal composition does not substantially remove the tungsten from the microelectronic device.

15. The method of claim 14, wherein the CMP contaminants comprises material selected from the group consisting of CMP slurry, reaction by-products of the polishing slurry, post-CMP residue, chemicals present in the wet etching composition, reaction by products of the wet etching composition, and any other materials that are the by-products of the CMP process, the wet etching, the plasma etching or the plasma ashing process.

16. The method of claim 14, wherein the particles comprise a species selected from the group consisting of silica, alumina, silicon carbide, silicon nitride, iron oxide, ceria, zirconium oxide, tin oxide, titanium dioxide, and mixtures of two or more of such components.

17. The method of claim 14, further comprising diluting the removal composition with solvent at or before a point of use, wherein the solvent comprises water.

* * * * *